United States Patent [19]
Ogawa

[11] Patent Number: 4,707,433
[45] Date of Patent: Nov. 17, 1987

[54] WATER-SOLUBLE PHOTOSENSITIVE MATERIAL WITH DICHROMATE AND LOW MOLECULAR WEIGHT GELATIN

[75] Inventor: Kazufumi Ogawa, Hirakata, Japan

[73] Assignee: Matsushita Electric Industrial Co., Ltd., Osaka, Japan

[21] Appl. No.: 788,700

[22] Filed: Oct. 21, 1985

Related U.S. Application Data

[63] Continuation of Ser. No. 594,432, Mar. 29, 1984, abandoned, which is a continuation of Ser. No. 379,100, May 17, 1982, abandoned.

[30] Foreign Application Priority Data

May 18, 1981 [JP] Japan ................................. 56-75236
Aug. 17, 1981 [JP] Japan ............................... 56-128542
Aug. 20, 1981 [JP] Japan ............................... 56-131178

[51] Int. Cl.$^4$ ............................................. G03C 1/66
[52] U.S. Cl. ..................................... 430/289; 430/7; 430/274; 430/293; 430/642
[58] Field of Search ............... 430/175, 176, 270, 289, 430/642, 7, 293, 274

[56] References Cited

U.S. PATENT DOCUMENTS

| | | | |
|---|---|---|---|
| 2,824,000 | 2/1958 | Eckhardt | 430/289 |
| 4,021,245 | 5/1977 | Nagatomo et al. | 430/539 |
| 4,131,466 | 12/1978 | Nomura et al. | 430/271 |
| 4,264,706 | 4/1981 | Sutton et al. | 430/289 |
| 4,357,415 | 11/1982 | Hartman | 430/7 |
| 4,360,590 | 11/1982 | Tomka | 430/642 |
| 4,433,043 | 2/1984 | Sawada et al. | 430/642 |
| 4,510,228 | 4/1985 | Tsubai et al. | 430/642 |

OTHER PUBLICATIONS

Chebiniak, P. et al., IBM Technical Disclosure Bulletin, vol. 13, No. 2, 7/1970, p.345.
Kosar, J., "Light–Sensitive Systems", J. Wiley & Sons, 1965, pp.52–62 and 99.
Veis, A., "The Macromolecular Chemistry of Gelatin", 1964, Academic Press, p. 76.

Primary Examiner—Charles L. Bowers, Jr.
Attorney, Agent, or Firm—Stevens, Davis, Miller & Mosher

[57] ABSTRACT

Water-soluble photosensitive materials and more particularly, a gelatin base photosensitive materials solution for producing color mosaic filters to be used in TV camera pickup devices. The water-soluble photosensitive material is characterized in that it does not form a gel even at room temperature (25±5° C.), has a good dyability and can be processable for development with water of room temperature (25±10° C., hereinafter, referred to as cold water development).

8 Claims, 5 Drawing Figures

WATER-SOLUBLE PHOTOSENSITIVE MATERIAL WITH DICHROMATE AND LOW MOLECULAR WEIGHT GELATIN

This is a continuation of application Ser. No. 594,432, filed Mar. 29, 1984 and now abandoned, which is a continuation of application Ser. No. 379,100, filed May 17, 1982 and now abandoned.

DESCRIPTION OF THE PRIOR ART

The present invention relates to water-soluble photosensitive materials.

Existing water-soluble photosensitive materials include water-soluble resins, for example, egg-white, glue, casein, poly(vinyl alcohol), gelatin, etc., to which a photopolymerization initiator (hereinafter, referred to as main photosensing agent) such as dichromate, chromate, or diazonium compound is added. All of these photosensitive materials are of a negative type.

These photosensitive materials have been used for etching a shadow mask of cathode ray tubes for color TV receivers, for forming colored bases of color stripes and of mosaic filters both used for image pickup tubes of color TV cameras and for solid image pickup plates thereof, for collotype printing of the same stripes and filters, and for other uses.

Water-soluble photosensitive materials for these purposes are prepared and processed, in general, through the following steps (1) to (8):

(1) preparation, of a photosensitive base solution, (2) addition of a main photosensing agent, (3) coating the resulting solution on the base plate, (4) pre-baking of the coated base plates, (5) exposure of the coating under covered with a mask, (6) hot water or cold water developing treatment of the plates, (7) burning of the treated plates, and (8) finishing of the plates to complete etched masks, colored bases, or printing plates.

In this process, the main photosensing agent is usually added just before the use of the photosensitive material solution because its pot life is generally short.

Meanwhile, gelatin-based photosensitive material solutions in use today have the following significant drawbacks as compared with other glue-based or casein-based photosensitive material solutions.

In conventional gelatin-based photosensitive material solutions, when the gelatin concentration is approximately 10–20% by weight, said solution mostly forms a gel at a temperature of 30°–40° C., whereas glue-based or casein-based photosensitive material solutions do not form a gel even at a temperature of 25±5° C. when the base material concentration is approximately 10–20% by weight, because the base material of the former photosensitive material is a gelatin (for photographic purposes, general industrial purposes, and food purposes) having an average molecular weight of 100,000–250,000, which is obtained by hot water extraction of cow bones treated with lime. Consequently, gelatin-based photosensitive material solutions, when applied to coating operation at a room temperature, i.e., at 25±5° C., will form a gel during the coating operation even if warmed previously, so that its smooth coating becomes impossible or controlling of its coating thickness becomes very difficult. Coatings of gelatin-based photosensitive material solutions are hence effected generally in a room which is kept at a constant temperature of 40°–45° C. Accordingly, a gelatin-based photosensitive material solution which does not form gels even at normal room temperature is desired in order to solve the knotty problem brought about by the fact that a constant temperature room facility must be operated at 40°–45° C. and in order simplify the present coating process.

BRIEF DESCRIPTION OF THE DRAWINGS

In FIGS. 1, 3, and 4, 1 represents areas where the photosensitive material remains, and 2 represents areas wherefrom the photosensitive material has been removed.

The following Reference Examples illustrate properties of the photosensitive material solutions based on the conventional alkali-processed (lime-processed) gelatin.

REFERENCE EXAMPLE 1

| | |
|---|---|
| Water | 1000 ml |
| Lime-processed gelatin (average molecular weight 150,000–250,000) | 150 g |
| Ammonium dichromate | 25 g |
| Ethanol | 60 ml |
| Benzoin tincture | 50 ml |
| Chromium alum (0.2% aqueous solution) | 20 ml |

Figure 1:
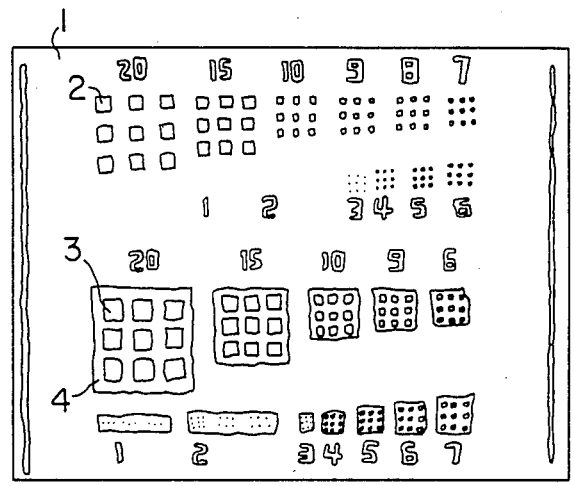
FIG. 1 is an enlarged view (magnification 120) of a defective pattern formed by the cold water development process using a conventional gelatin-based photosensitive material photoresist.

A mixture of the above composition was thoroughly stirred at 50°–60° C. to make up a solution, which is gelled on cooling to room temperature. The gel formed was dissolved again by heating to 50° C. and was coated on a substrate. The coating was image-exposed and subjected to cold water development processing for 10 minutes. The resulting pattern obtained is shown in FIG. 1, wherein 1 and 2 are as mentioned above. From the areas represented by 2, the photosensitive material was not completely removed. Thus, it is evident that the conventional gelatin-based photosensitive material does not give a satisfactory result by the cold water development process.

REFERENCE EXAMPLE 2

A photosensitive material solution was prepared in the same manner as Reference Example 1, except that a lime-processed gelatin (average molecular weight 100,000–200,000, 150 g) suitable for general industrial purposes was used. This photosensitive material solution was gelled on standing at 10° C. for a whole day. In this case, the photosensitive material solution prepared by redissolving the gel at about 40° C., although not readily gelling even when cooled to 25° C., did not give a sharp pattern, similarly to that obtained in Reference Example 1, when coated on a substrate, image-exposed, and subjected to the cold water development processing.

REFERENCE EXAMPLE 3

A photosensitive material solution was prepared in the same manner as Reference Example 1 except that 20 g of potassium dichromate and 20 g of ammonium dichromate were used as a main photosensing agent in place of 25 g of ammonium dichromate, and 150 g of a lime-processed gelatin (average molecular weight 150,000–250,000) suitable for photographic purposes was used. The solution was gelled completely at 25° C. and the gel could be scarcely redissolved at about 50° C. The results of its coating on a substrate, image-exposure, and development processing were similar to those obtained in Reference Example 1.

On the other hand, for using gelatin-based photosensitive material solutions for color filter production, the following process is applied in general:

(1) Preparation of a photosensitive material base solution, (2) Addition of a main photosensing agent, (3) Coating the resulting solution on the base plate, (4) Pre-baking of the coated plates, (5) Exposure of the coating under covered with a mask, (6) Hot water developing treatment of the plates, (7) Burning of the treated plates, and (8) Dyeing of the remaining photosensitive material.

However, since the base material of conventional gelatin base photosensitive material solutions is a gelatin (for photographic purposes, for general industrial purposes, and food purposes) of high molecular weight (average molecular weight: 100,000–250,000), which is obtained by hot water extraction of cow bones treated with lime, most of the amide groups in the gelatin have been converted into carboxyl groups by the treatment with lime, so that the photosensitive material solutions exhibit low isoelectric points (pH). That is to say, photosensitive materials based on the conventional lime-processed gelatin have a low content of acid dye-combining sites (i.e. amino groups). Accordingly, these photosensitive materials are required to be coated to a thickness of about 2–3μ for obtaining a dyed color density necessary for the color filter. The coating of 2–3μ, however, is too thick for satisfying the pattern precision of color mosaic filters of unit pattern size (pattern line width) about 5μ, for which demand has arisen in recent years with increasing need for higher precision of said filters to be used for solid image pickup elements.

SUMMARY OF THE INVENTION

The first object of the present invention is to provide a gelatin-based, water-soluble photosensitive material of which aqueous solutions for photosensitive material preparations do not gel even at a room temperature (25±5° C.).

The second object of the present invention is to provide an aqueous solution of gelatin-based photoresistive material for color filter production wherein the gelatin has a high content of amino groups, that is, the gelatin is dyable with ease to dense colors.

DETAILED DESCRIPTION OF THE INVENTION

It is known that the less the molecular weight of gelatin the lower the gelling temperature thereof.

Accordingly, in order to achieve the first object of the present invention, collagen contained in cow bones is previously treated with a chemical reagent to remove unnecessary organic matter, and then the high molecular weight gelatin prepared by said treatment is decomposed by heat or with a proteolytic enzyme and extracted to prepare a water-soluble gelatin of average molecular weight 5,000–70,000.

This low molecular weight gelatin has practically no difference in properties from general high molecular weight gelatins, except that the former is less liable to gel. The low molecular weight gelatin can be dissolved in water even at room temperature.

Consequently, it is possible by using such a low molecular weight gelatin to prepare a photosensitive material solution which does not gel when applied as a coating even at room temperature (25±5° C.).

Figure 2:
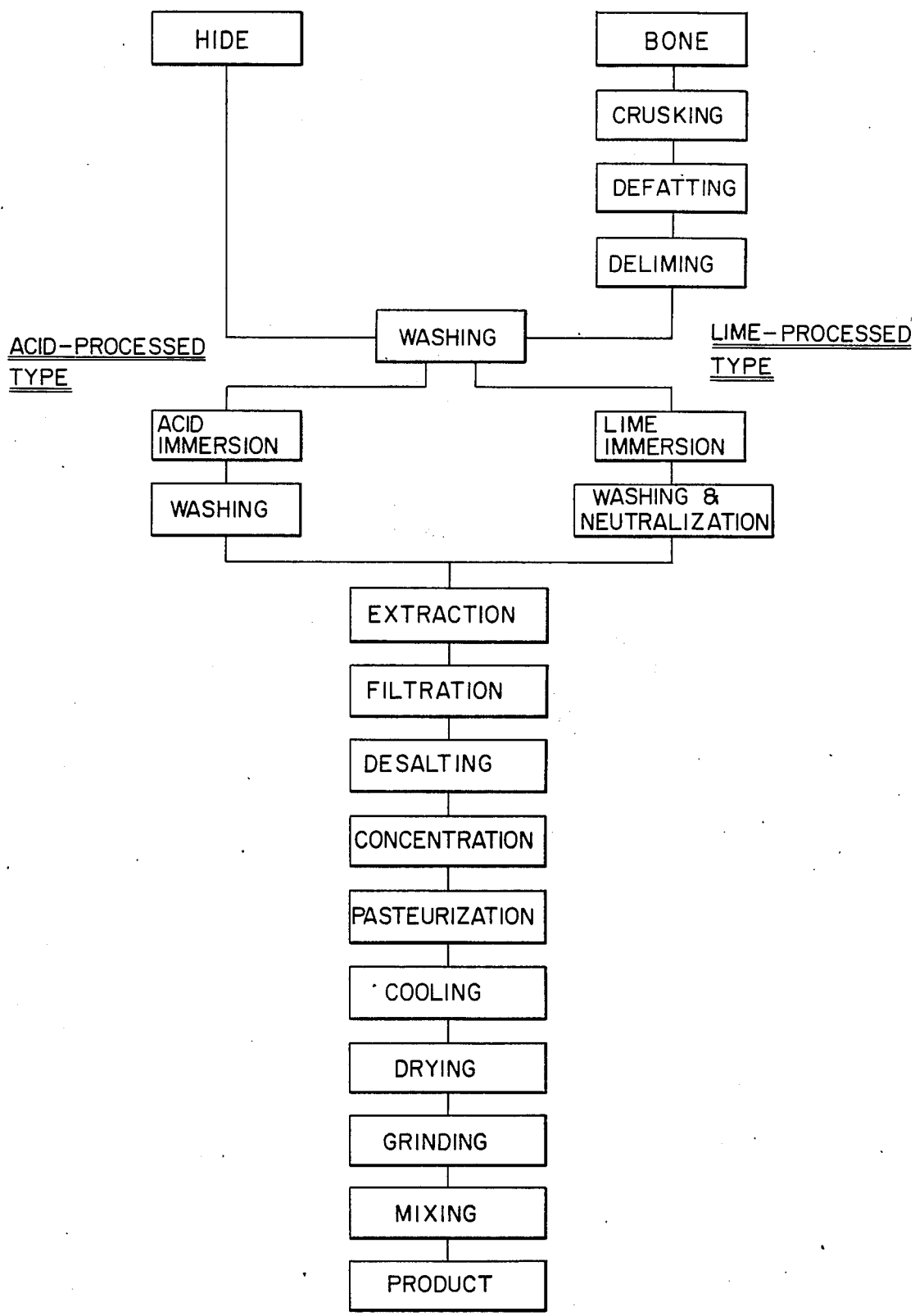
FIG. 2 is a flow diagram of two processes for producing gelatin, by acid treatment and by alkali (lime) treatment, to illustrate the difference therebetween.

It is also known that gelatins are generally produced by the processes shown in FIG. 2. An important difference between acid-processed gelatin and alkali (lime)-processed gelatin, shown in FIG. 2, is found in isoelectric points of their solutions. Whereas acid-processed gelatin, containing many amino groups, exhibits isoelectric points of pH 7–9, alkali-processed gelatin exhibits those of pH as low as 4.8–5.1 because most of its amino groups have been converted into carboxyl groups by the treatment with lime. Therefore, acid-processed gelatin has more sites (i.e., amino groups) for combining with acid dyes, and is therefore more dyable.

This acid-processed gelatin exhibits practically no differences in properties from general alkali-processed gelatin except that the former is more dyable with acid dyes and exhibits lower gelling temperatures. The acid-processed gelatin can also be dissolved in water even at room temperature.

Accordingly, in order to achieve the second object of the present invention, acid-processed gelatin having low-molecular weight as mentioned above is used to prepare photosensitive material solutions for color filter production. Thus, gelatin-based photosensitive material solutions can be obtained which do not gel during coating operations even at room temperature and give photosensitive material dyable with ease to dense colors.

To illustrate formulations and performance characteristics of the photosensitive material solution of the present invention, the following Examples will be given:

EXAMPLE 1

| Water | 1000 ml |
|---|---|
| Lime-processed gelatin (average molecular weight 5,000–10,000) | 400 g |
| Ammonium dichromate | 80 g |
| Ethanol | 60 ml |
| Benzoin tincture | 50 ml |
| Chromium alum (0.2% aqueous solution) | 20 ml |

Figure 3:
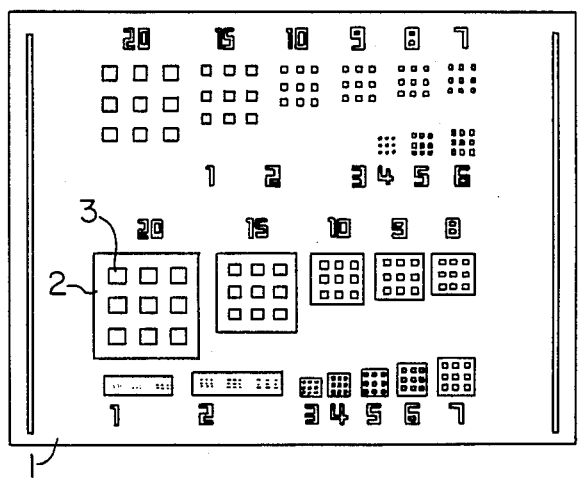
FIG. 3 is an enlarged view (magnification 120) of a pattern formed by the cold water development process using the gelatin-based photosensitive material of an embodiment of the present invention.

A mixture of the above composition was thoroughly stirred at 50°–60° C. to make up a solution, which did not form a gel, though it was cooled to 10° C. and further allowed to stand for a whole day, and indicated a viscosity of 140 cps at room temperature. The solution was coated on a glass base plate to prepare a photosensitive coating, which was exposed to ultraviolet light using a test pattern mask of chromium plate and was subjected to cold water development for three minutes, thereby a pattern as shown in FIG. 3 was obtained. The thickness of the photosensitive coating obtained by a 3,000 rpm spiner coating was 0.7 μm. The patterned numerals in FIG. 3 indicate actual sizes (microns) of corresponding unit patterns.

As is evident from FIG. 3, the photosensitive material solution of the present invention gives a satisfactory pattern even when the cold water development process is applied.

EXAMPLE 2

A photosensitive material solution was prepared and tested in the same manner as Example 1 except that the amount of ammonium dichromate as the main photosensing agent was reduced to 50 g, and 300 g of a lime-processed gelatin having an average molecular weight of 10,000-20,000 was used. This solution did not form a gel and indicated a viscosity of about 450 cps under the same conditions as in Example 1, and gave a pattern equal in quality to that of Example 1.

EXAMPLE 3

| Water | 1000 ml |
|---|---|
| Lime-processed gelatin (average molecular weight 15,000-30,000) | 250 g |
| Potassium dichromate | 20 g |
| Ammonium dichromate | 20 g |
| Lead nitrate | 2.5 g |
| Ethanol | 30 ml |

A mixture of the above composition was thoroughly stirred at 50°-60° C. to make up a solution, which did not form a gel, though it was cooled to 20° C. and allowed to stand for a whole day, and indicated a viscosity of 200 cps. The solution was coated on a glass base plate to prepare a photosensitive coating, which gave a pattern comprising clear lines of width as small as about 4 μm, through exposing to ultraviolet light using a test pattern mask of chromium plate. The difference between this Example and Example 1 is that this photosensitive material solution contained potassium dichromate and ammonium dichromate as the main photosensing agents and lead nitrate as an auxiliary.

EXAMPLE 4

A photosensitive material solution was prepared and tested in the same manner as in Example 3 except that 200 g of a lime-processed gelatin having an average molecular weight of 30,000-70,000 was used. As a result, the photosensitive material solution did not form a gel and exhibited a viscosity of 270 cps.

As this Example shows, results similar to that obtained in Example 3 are obtainable even when a gelatin having an average molecular weight of 30,000-70,000 is used.

Besides the above Examples, a photosensitive material solution which does not form a gel even at a room temperature and in addition having a high viscosity could be prepared by mixing a small amount of a lime-processed high average molecular weight gelatin (molecular weight: 100,000-200,000) with a lime-processed low average molecular weight gelatin (molecular weight: 5,000-15,000). The results obtained when using such a solution are shown in Example 5.

EXAMPLE 5

A photosensitive material solution was prepared and tested in the same manner as in Example 1 except for using a mixture of 300 g of a low-molecular weight gelatin (average molecular weight: 5,000-10,000) and 60 g of a high average molecular weight gelatin (molecular weight: 100,000-200,000) as a lime-processed gelatin, whereby results equal to those of Example 1 were obtained except that the viscosity of the photosensitive material solution was 250 cps at a room temperature.

EXAMPLE 6

A photosensitive material solution was prepared in the same manner as in Example 3 except for using 150 g of a low average molecular weight gelatin (molecular weight: 10,000-20,000) and 100 g of a high molecular weight gelatin (average molecular weight: 100,000-200,000). This solution formed a gel at room temperature.

The above Examples have revealed that it is possible, by using a gelatin comprising mainly a low average molecular weight gelatin (molecular weight: 5,000-70,000), to prepare a photosensitive material solution which does not form a gel and consequently exhibits a low rate of viscosity change.

Accordingly, when such a photosensitive material solution based on a low molecular weight gelatin is used, the thickness of coating thereof can easily be controlled, and thus a uniform coating layer thereof can be obtained, and further, the cold water development process can also be utilized. These results contribute greatly to coating process rationalization and energy saving.

While dichromates were used as the photopolymerization initiator in the above Examples, it is obvious that use of a free radical type of initiator, for instance, a diazo compound or peroxide, also gives similar favorable results. The addition of dichromates may also be done, as generally practiced, just before the application of photosensitive material solutions.

The auxiliary benzoin tincture used in the Examples inhibits clot-formation, and has hardening effect, and ethanol gives anti-foaming effect, and also improves the extensibility of the photosensitive material solutions.

EXAMPLE 7

| Water | 1000 ml |
|---|---|
| Acid-processed gelatin (average molecular weight: 5,000-20,000) | 400 g |
| Ammonium dichromate | 40 g |
| Ethanol | 60 ml |
| Benzoin tincture | 50 ml |
| Chromium alum (0.2% aq. solution) | 20 ml |

A mixture of the above composition was thoroughly stirred at 50°-60° C. to make up a solution, which did not form a gel, though it was cooled to 20° C. and allowed to stand for a whole day, and indicated a viscosity of 140 cps at room temperature. The solution was coated on a glass base plates to prepare a photosensitive coating, which was exposed to ultraviolet light using a test pattern mask of chromium plate and was subjected to cold water development for three minutes. Then, the remaining photosensitive material was dyed with Eriosine Scarlet RE (supplied by Japan Ciba-Geigy Corp.)

Figure 4:
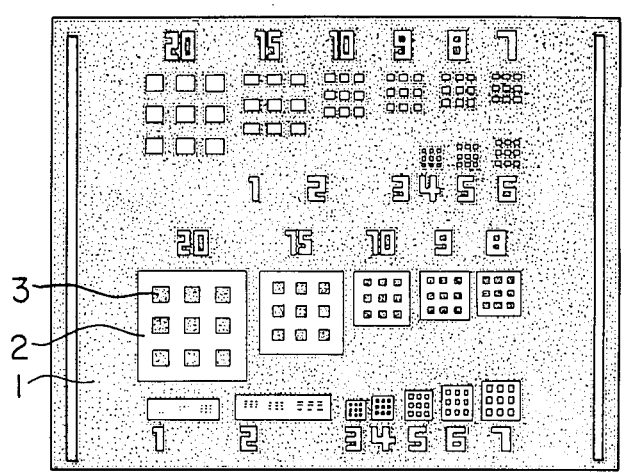
FIG. 4 is an enlarged view (magnification 120) of the same pattern as FIG. 3, but dyed after pattern development.

The dyed state is shown in FIG. 4. The thickness of the photosensitive coating obtained by a 4,000 rpm spiner coating was 0.68 μm, and the pattern edge boundaries were distinct and clear.

EXAMPLE 8

Figure 5:
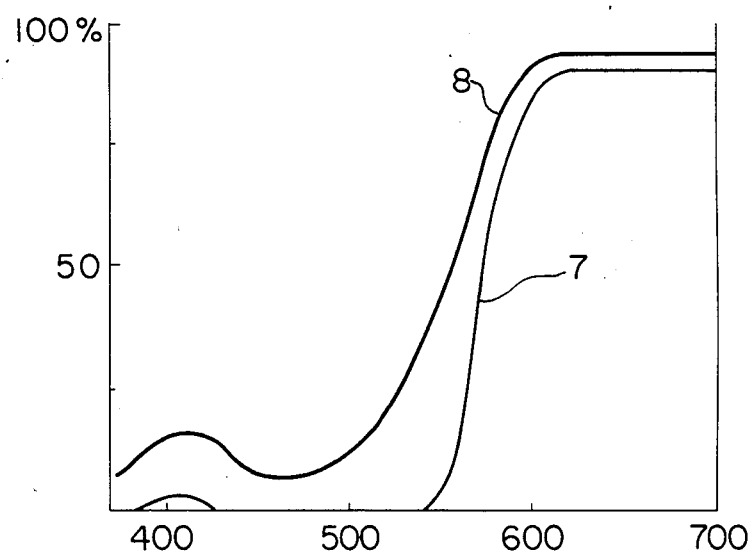
FIG. 5 shows spectra of two types of dyed photosensitive material of the same thickness prepared by using an acid-processed gelatin 7 and an alkali (lime)-processed gelatin 8, to illustrate the difference therebetween.

A photosensitive material solution was prepared and tested in the same manner as in Example 7 except for using 300 g of a lime-processed gelatin (average molecular weight: 10,000-20,000). This solution did not form a gel and indicated a viscosity of about 210 cps, at room temperature, and gave a pattern equal in quality to that of Example 7. However, results of the dyeing test (80° C., 10 min.) by using the same dye as used in Example 7 indicated that this photosensitive coating was not dyed as well as that of Example 7, whereas its thickness was almost the same (0.7 μm). The visible light spectra of dyed photosensitive coating of Examples 7 and 8 are shown in FIG. 5 for comparison.

EXAMPLE 9

| Water | 1000 ml |
|---|---|
| Acid-processed gelatin (average molecular weight: 30,000–70,000) | 200 g |
| Potassium dichromate | 10 g |
| Ammonium dichromate | 30 g |
| Lead nitrate | 2.5 g |
| Ethanol | 30 ml |

A mixture of the above composition was thoroughly stirred at 50°-60° C. to make up a solution, which did not form a gel, though it was cooled to 20° C. and allowed to stand for a whole day, and indicated a viscosity of 160 cps. The solution was coated on a glass base plate to prepare a photosensitive coating, which gave a pattern comprising clear lines of width as small as about 4 μm, through exposing to ultraviolet light using a test pattern mask of chromium plate. The photosensitive coating was well dyed to the same color density in the same manner as in Example 7 (the coating thickness was also almost the same).

EXAMPLE 10

A photosensitive material solution was prepared and tested in the same manner as in Example 9 except for using 300 g of an acid-processed gelatin (average molecular weight: 5,000-20,000). The solution did not form a gel and indicated a viscosity of about 140 cps, at room temperature, and gave pattern forming results and dyeing results, as equal to those of Example 9.

EXAMPLE 11

A photosensitive material solution was prepared and tested in the same manner as in Example 7 except for using a mixture of 300 g of an acid-processed low molecular weight gelatin (average molecular weight: 5,000-20,000) and 40 g of a lime-processed high molecular weight gelatin (average molecular weight: 100,000-200,000), and the same results were obtained as in Example 7 except that the viscosity of the solution was 250 cps at room temperature.

As is evident from the above Examples 7-11, the dyed color density per unit thickness of photosensitive material can be increased by use of acid-processed gelatin to a level that enables the photosensitive material to be used as a color filter even when the thickness of the photosensitive material is as small as about 0.6 μm. This makes the formation of fine patterns (unit pattern size ca. 5μ) easy.

What is claimed is:

1. A photosensitive solution for making color filter arrays which does not gel at 20°-30° C., comprising:
    (a) gelatin having an average molecular weight of 30,000 to 70,000 obtained by decomposing a higher molecular weight gelatin;
    (b) water; and
    (c) an amount of photosensitive dichromate sufficient to cause polymerization of said 30,000 to 70,000 molecular weight gelatin when the solution is coated on a substrate and exposed to light, whereby a sharp pattern is obtained when the resultant coating is developed with cold water.

2. A solution according to claim 1, wherein the higher molecular weight gelatin is acid-processed gelatin and the resultant polymer is readily dyeable with acid dyes.

3. A solution according to claim 1, wherein the higher molecular weight gelatin is lime-processed gelatin.

4. A solution according to claim 1, which also contains higher molecular weight gelatin.

5. A solution according to claim 1, which contains a hardening agent.

6. A photosensitive solution which does not gel at 20°-30° C., comprising:
    (a) a gelatin having an average molecular weight of 30,000 to 70,000 obtained by decomposing a higher molecular weight gelatin;
    (b) water; and
    (c) an amount of photosensitive dichromate sufficient to cause polymerization of said 30,000 to 70,000 molecular weight gelatin when the solution is coated on a substrate and exposed to light, whereby a sharp pattern is obtained on development with cold water.

7. A photosensitive solution for making color filter arrays which does not gel during spin coating, comprising:
    (a) an acid-processed gelatin having an average molecular weight of 30,000 to 70,000 obtained by decomposing a higher molecular weight gelatin;
    (b) water; and
    (c) an amount of photosensitive dichromate sufficient to cause polymerization of said 30,000 to 70,000 molecular weight gelatin when the solution is used in a spin coating process and exposed to light, whereby the coating obtained can be developed with cold water and displays good dyeability characteristics.

8. A photosensitive solution for making color filter arrays which does not gel during spin coating, comprising:
    (a) a gelatin having an average molecular weight of 30,000 to 70,000 obtained by decomposing a higher molecular weight gelatin;
    (b) water; and
    (c) an amount of photosensitive dichromate sufficient to cause polymerization of said 30,000 to 70,000 molecular weight gelatin when the solution is used in a spin coating process and exposed to light, whereby the coating obtained can be developed with cold water and displays sharp patterns after development with cold water.

* * * * *